United States Patent [19]

Hayashi

[11] Patent Number: 4,820,652
[45] Date of Patent: Apr. 11, 1989

[54] MANUFACTURING PROCESS AND STRUCTURE OF SEMICONDUCTOR MEMORY DEVICES

[75] Inventor: Hisao Hayashi, Kanagawa, Japan

[73] Assignee: Sony Corporation, Tokyo, Japan

[21] Appl. No.: 936,512

[22] Filed: Dec. 1, 1986

[30] Foreign Application Priority Data

Dec. 11, 1985 [JP] Japan .................................. 60-278182
Dec. 11, 1985 [JP] Japan .................................. 60-278183
Dec. 12, 1985 [JP] Japan .................................. 60-279957

[51] Int. Cl.⁴ ........................................... H01L 29/94
[52] U.S. Cl. ...................................... 437/52; 437/78;
437/89; 156/643; 156/644; 357/23.6
[58] Field of Search ..................... 437/52, 47, 48, 49,
437/89, 78; 156/643, 644; 357/23.6

[56] References Cited

FOREIGN PATENT DOCUMENTS 0088451 9/1983 European Pat. Off. .
0135942 9/1984 European Pat. Off. .
0168528 12/1984 European Pat. Off. .

OTHER PUBLICATIONS

International Electron Devices Meeting, Washington, D.C., 1–4 Dec. 1985, pp. 718–721, *IEEE*, U.S.; M. Ohkura et al.: "A Three Dimensional Dram Cell of Stacked Switching-Transistor in SOI (SSS)".
International Electron Devices Meeting, Washington, D.C., Dec. 1–4, 1985, pp. 710–713, *IEEE*, M. Sakamoto et al.: "Buried Storage Electrode (BSE) Cell for Megabit Drams".
Journal of the Electrochemical Society, vol. 132, No. 11, Nov. 1985, pp. 2748–2758, New Hampshire, U.S.; L. O. Wilson et al.: "Lateral Epitaxial Growth Over Oxide".
Japanese Publication, Nikkei Microdevices, SA No. 52749, pp. 16–19, (1985), (with English language summary).

*Primary Examiner*—Olik Chaudhuri
*Attorney, Agent, or Firm*—Ronald P. Kananen

[57] ABSTRACT

A manufacturing process and structure of a semiconductor memory device especially a Dynamic Random Access Memory (DRAM), each memory cell of which comprises one transistor and one capacitor. The process comprises the steps of (a) selectively forming an insulating layer on a semiconductor substrate; (b) forming a semiconductor layer on the insulating layer, the semiconductor layer being connected to the semiconductor substrate via the insulating layer; (c) forming a protective layer on the semiconductor layer; (d) forming a window having a predetermined width through the protective layer at a position of the protective layer offset from an end of the insulating layer and forming a trench through the window with the insulating layer and protective layer serving as masks so that the semiconductor layer is still connected to the semiconductor substrate via the end of the insulating layer; and (e) forming the capacitor in the trench with the transistor formed in the semiconductor layer. Both transistor and capacitor are connected to a region of the semiconductor substrate adjacent to a side wall of the insulating layer. In addition, another transistor of the adjacent memory cell is separated from the capacitor with the insulating layer located below the transistor.

20 Claims, 5 Drawing Sheets

MANUFACTURING PROCESS AND STRUCTURE OF SEMICONDUCTOR MEMORY DEVICES

BACKGROUND OF THE INVENTION

The present invention relates to a manufacturing for and structure of semiconductor memory devices and particularly to dynamic type semiconductor memory devices such as DRAMs (Dynamic Random Access Memories) which have achieved high integrations and high performances in which trenches are installed within respective capacitor regions.

A dynamic type memory cell has extensively been used for a memory element since it can be integrated with high density. The dynamic type memory cell includes a single memory capacitor and a single switching transistor interconnected to the capacitor, as illustrated in FIG. 6. However, as high integrations of IC memory devices with high densities are advanced, an occupied area per memory cell is decreased and accordingly an electric charge amount to be stored in each capacitor is remarkably reduced. Therefore, the contents of some memory cells will erroneously be read.

To solve such a problem as described above, a trench is formed on a surface of a substrate of the memory capacitor region to increase the surface area. Therefore, the capacity of the memory capacitor is increased and an amount of electric charge is thus increased.

FIGS. 5(A) and 5(B) show a conventional 4M bit memory cell structure using a trench capacitor disclosed in a Japanese document of NIKKEI MICRODEVICES pages 16 through 19 published in the spring of 1985.

As shown in FIGS. 5(A) and 5(B), each transistor is enclosed with a separation oxidized film 42 located within a separation recess. A polycrystalline Si electrode 43 is formed inside of the oxidized film 42 with respect to the capacitor to constitute one electrode of the capacitor and is connected to a source for the transistor. A polycrystalline Si cell plate 45 sandwiched with a capacitor separation film 44 constitutes the other electrode of the capacitor. A drain D is connected to a bit line (B Line) via a contact hole 46.

In the above-described cell structure, both capacitor and transistor are formed in parallel to the bit line (B Line). In addition, a single trench is provided with both functions of an inter-element separation and of formation of the single capacitor.

In the above-described memory cell structure using the conventional trench capacitor, the connection between the capacitor and transistor cannot be carried out in a self alignment manner. In addition, the polycrystalline Si provides means for connecting the capacitor to the transistor. In order to form the capacitor and to separate electrically one of the memory elements from the adjacent memory element, a plurality of thin $SiO_2$ films must accurately be formed within the respective polycrystallines Si located within the trenches. To achieve this, an extremely high and complicated IC manufacture technology are required. Furthermore, in the conventional memory cell structure using the trench capacitor, both occupying areas required to separate one of the memory elements from the adjacent memory element and required to form the capacitor are still large in order to manufacture an integrated memory device with a high density and with a sufficient memory capacity.

SUMMARY OF THE INVENTION

With the above-identified problem in mind, it is an object of the present invention to provide a manufacturing process for and a structure of a semiconductor memory device which can form a trench capacitor and transistor in a self alignment manner.

It is another object of the present invention to provide the manufacturing process and structure of the semiconductor memory device having the trench capacitor appropriate for the high integration of the semiconductor memory device.

It is still another object of the present invention to provide the manufacturing process and structure of a Dynamic Random Access Memory (DRAM) having small-sized memory cells and having capacitors with high capacitances.

The above-described objects can be achieved by providing a manufacturing process of a semiconductor memory device, each memory cell thereof comprising one transistor and one capacitor, the process comprising the steps of: (a) selectively forming an insulating layer on a semiconductor substrate; (b) forming a semiconductor layer on the insulating layer, the semiconductor layer being connected to the semiconductor substrate via the insulating layer; (c) forming a protective layer on the semiconductor layer; (d) forming a window having a predetermined width through the protective layer at a position of the protective layer offset from an end of the insulating layer and forming a trench through the window with the insulating layer and protective layer serving as masks so that the semiconductor layer is still connected to the semiconductor substrate via the end of the insulating layer; and (e) forming the capacitor in the trench with the transistor formed in the semiconductor layer.

The above-described objects can also be achieved by providing a structure of a semiconductor memory device, each memory cell of the memory device comprising: (a) a transistor disposed on an insulating layer selectively formed on a semiconductor substrate; and (b) a capacitor formed in a trench formed in the semiconductor substrate, both transistor and capacitor being connected to a region of the semiconductor substrate adjacent to a side wall of the insulating layer.

The above-described objects can also be achieved by providing a structure of a semiconductor memory device, each memory cell thereof comprising: (a) a transistor disposed on an insulating layer selectively formed on an semiconductor substrate; and (b) a capacitor formed in a trench formed in the semiconductor substrate, a transistor of another memory cell adjacent to the capacitor being separated from the capacitor with the insulating layer located below the transistor.

DESCRIPTION OF THE PREFERRED EMBODIMENTS

Figure 6:
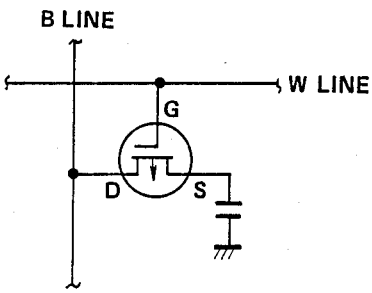
FIG. 6 is a circuit diagram of an example of a memory cell in the DRAM having a single MOS transistor. and single capacitor.

A circuit configuration of the Dynamic Random Access Memory (DRAM) has already been described with reference to FIG. 6. In FIG. 6, one electrode of the capacitor is connected to a source of the MOS transistor. A gate G of the MOS transistor is connected to a word W Line and a drain D thereof is connected to a bit B Line.

Next, a manufacturing process of the DRAM according to the present invention will be described below with reference to FIGS. 1(A) through 1(F).

FIG. 1(A)

Figure 1:
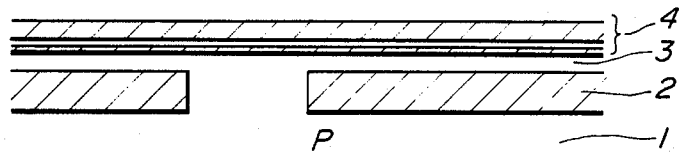
FIGS. 1(A) through 1(F) are partial sectional views of a trench portion of each memory cell for explaining a manufacturing process for a Dynamic Random Access Memory (DRAM) according to the present invention.
Figure 1:
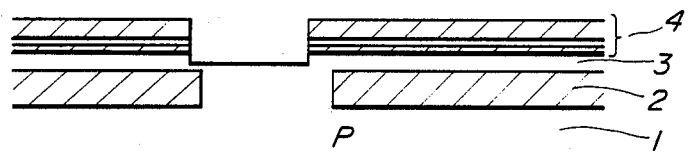
Figure 1:
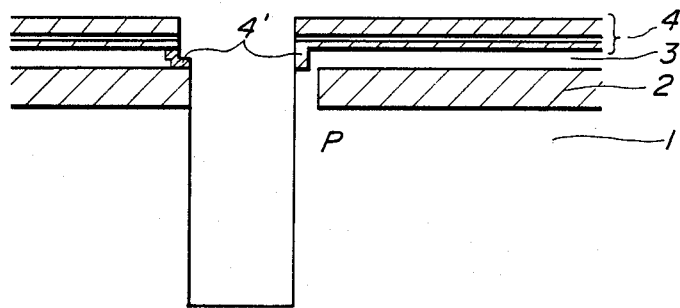
Figure 1:
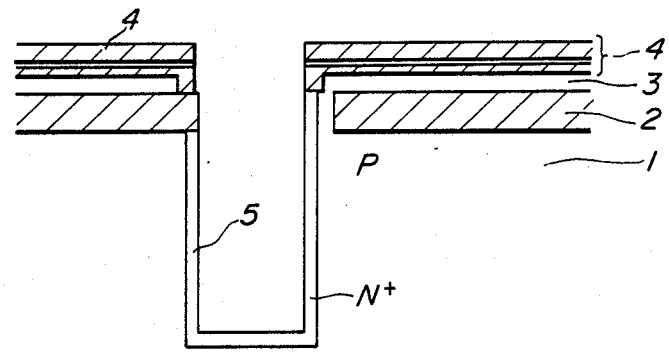
Figure 1:
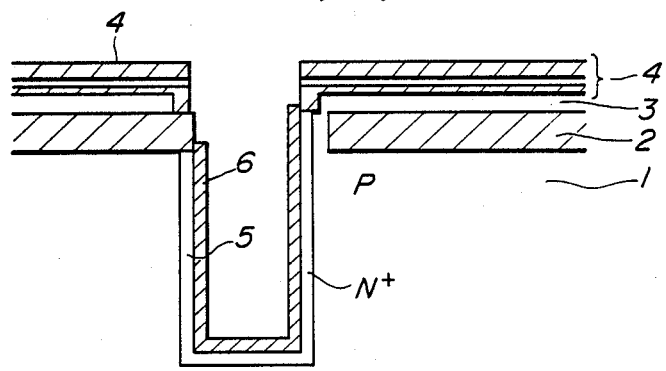
Figure 1:
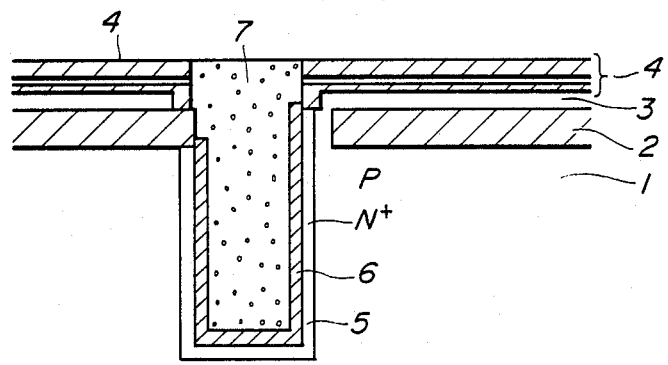

In a step shown in FIG. 1(A), a lateral crystal growth is carried out through a window of $SiO_2$ having a 1.0 $\mu m$ width with a single crystal of P type Si substrate 1 as seed to grow up a Si single crystal layer 3 on a $SiO_2$ layer 2. Furthermore, a film 4 is formed on Si single crystal layer 3 having three layers: a $SiO_2$ (silicon dioxide) film having a thickness of 200 Å (0.2 $\mu mm$); $Si_3N_4$ (trisilicon tetranitride) film having a thickness of 100 Å (1 $\mu mm$); and $SiO_2$ film having a thickness of 5000 Å (5 $\mu mm$). In a case where a super thin film transistor is formed within a polycrystalline Si, the Si layer 3 is a polycrystalline Si.

FIG. 1(B)

In a step shown in FIG. 1(B), a window having a width of 1 $\mu m$ is patterned by a photo etching method at a position of the three-layer film 4 which is deviated 0.3 $\mu m$ from an end of $SiO_2$ layer 2 with a photo resist applied to the three-layer film 4. Thereafter, an RIE method (Reactive Ion Etching) is used to remove the three-layer film 4 and Si single crystal layer 3 with a small amount thereof being left on the end of $SiO_2$ layer 2 of the left side as viewed from FIG. 1(B). In order to ensure the separation between the capacitor and adjacent transistor of another memory cell in the finished DRAM, a small amount of the Si single crystal layer 3 is left on the end of the insulating layer made of SiOhd 2 layer 2 at the left side as viewed from FIG. 1(B). However, this is not always essential procedure.

FIG. 1(C)

In a step shown in FIG. 1(C), the RIE method is used to provide a trench after an oxidization on a surface of the trench formed in the step shown in FIG. 1(B). It is noted that numeral 4′ denotes oxidization films. Since the window having the width of 1 $\mu m$ is deviated 0.3 $\mu m$ from the end of $SiO_2$ layer 2 as appreciated from FIG. 1(C), the trench having a width of 0.7 $\mu m$ is consequently formed.

FIG. 1(D)

In a step shown in FIG. 1(D), a donor is diffused on the inside surface of the trench to form N+ region 5. The N+ region 5 may, alternatively, be formed in such a way that the donor is solid-phase diffused after a PSG (Phospho-Silicate Glass) film is epitaxially grown up on the inside surface of the trench by a CVD (Chemical Vapour Deposition) method. It is noted that the N+ region 5 serves as one electrode of the capacitor and is integrated to the source of the transistor formed within the Si layer 3 for a TFT (Thin Film Transistor).

FIG. 1(E)

In a step shown in FIG. 1(E), a heat oxidation on the inner side surface of the trench forms a capacitor separation film 6.

FIG. 1(F)

In a step shown in FIG. 1(F), a polycrystalline Si 7 is buried into the trench to function as the cell plate of the capacitor. After removal of the $SiO_2$ film, an uppermost film of the three-layer film 4, and the surface of the polycrystalline Si 7 are oxidized. The surface except the polycrystalline Si 7 is covered with $Si_3N_4$ film. Thereafter, with $Si_3N_4$ film of the three-layer film 4 removed, a gate oxidization film of the transistor is grown up to form the transistor.

Figure 2:
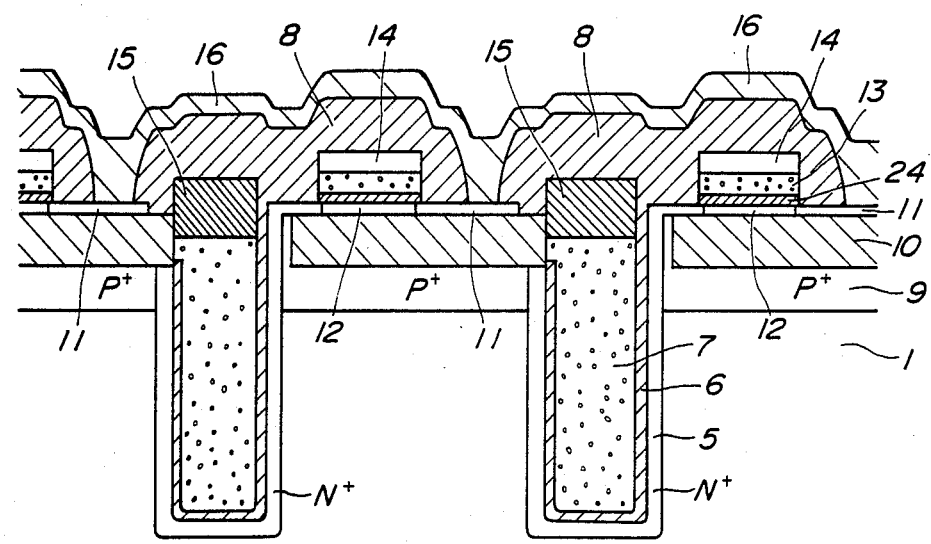
FIG. 2 is a partial cross sectional view of a structure of the DRAM cut away along a channel length direction thereof (along a line A—A of FIG. 4) according to the present invention.
Figure 3:
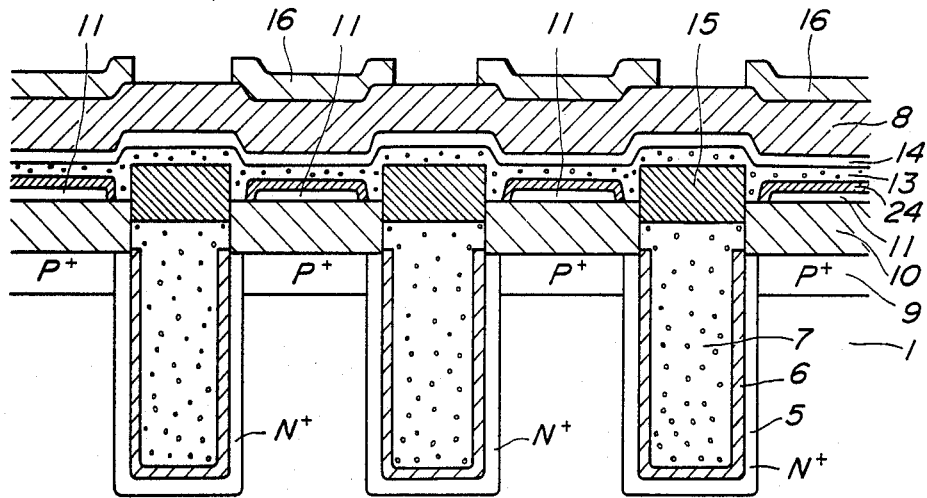
FIG. 3 is a partial cross sectional view of a structure of the DRAM cut away along a channel width direction thereof (along a line B—B of FIG. 4) according to the present invention.

FIG. 2 is a cross sectional view of a novel DRAM cut away along a channel elongation direction of the DRAM manufactured in accordance with the present invention. FIG. 3 is a cross sectional view of the novel DRAM cut away along a channel width direction of the DRAM manufactured according to the present invention. The N+ region 5 formed with the donor diffused in the inside surface of the trench used to form the capacitor serves as the one electrode of the capacitor. The heat oxidization film 11 having a thickness of 100 Å serves as the capacitor separation film and the polycrystalline Si layer 7 burried in the trench serves as the cell plate of the capacitor. A TFT (Thin Film Transistor) is installed on a selective oxidization film 10 on a P+ diffusion layer 9 of a P-type Si substrate. The Si semiconductor layer 11 is single crystallized by a recrystallization technique. With a gate oxidized film 24, polycrystalline Si gate electrode 13, and W (tungsten)-Si electrode 14 as masks, both source region and drain region are formed by an ion implanatation process in the self alignment manner. The source region is connected to a capacitor electrode N+ and the drain region is connected to a bit line 16 of a drain electrode 4 Aλ. A word line comprising the polycrystalline Si 13 and W-Si layer 14 is covered with a CVD (Chemical Vaporized Diffusion) oxidized film 8.

Figure 4:
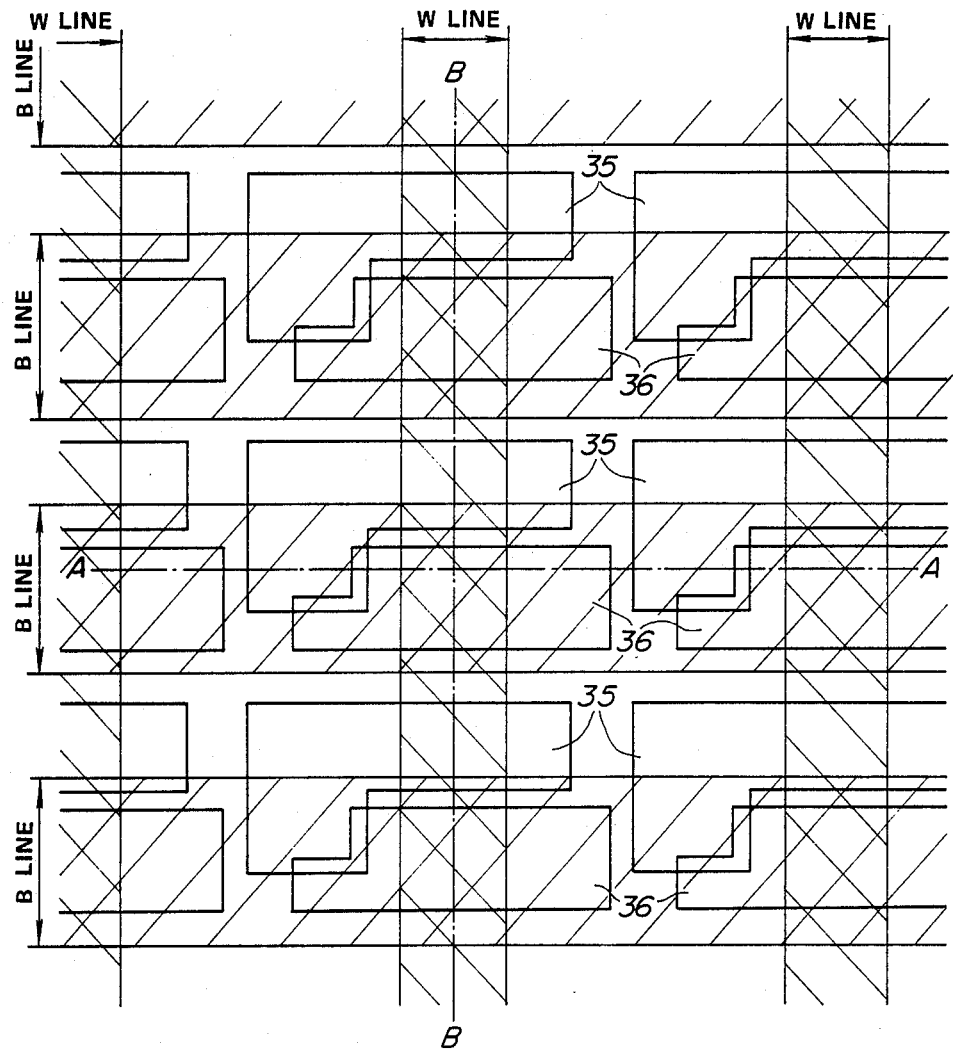
FIG. 4 is a schematic view of an arrangement of mask patterns in the DRAM according to the present invention.
Figure 5:
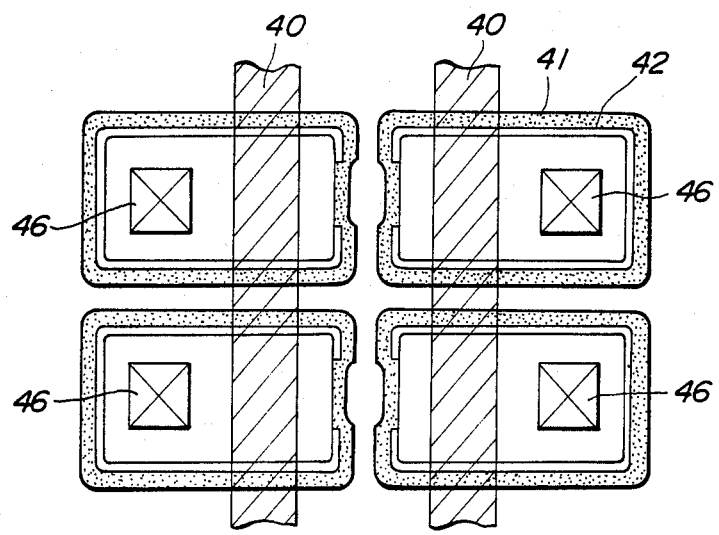
FIGS. 5(A) and 5(B) are longitudinal and lateral cross sectional views of a conventional memory cell structure of the DRAM disclosed in the Japanese document of NIKKEI MICRODEVICES at pages 16 through 19, published in spring of 1985.
Figure 5:
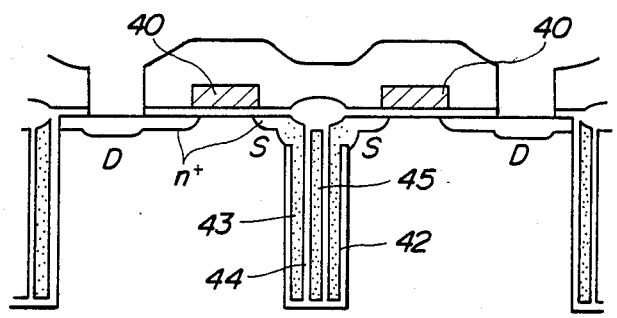

FIG. 4 is a schematic view representing a positional relationship between a word line, bit line, trench mask pattern 35, and transistor mask pattern 36. It is noted that FIG. 2 shows the cross sectional view cut away along a dot-and-dash line A—A of FIG. 4 and FIG. 3 shows the other cross sectional view cut away along another dot-and-dash line B—B of FIG. 4. Both transistor and capacitor are connected by means of an N+ layer at a position over which the trench mask pattern 35 and transistor mask pattern 36 are overlapped. An example of the specification of the manufactured DRAM according to the present invention is as follows:

Cell Size: $1.5 \times 2.5 = 3.75$ $\mu m^2$
Capacitor: 5.8 (Peripheral)$\times 2.5$ (Trench) $\mu m^2$ +1.2 (planar) $\mu m^2$ = 15.7 $\mu m^2$
Transistor: W=0.8 $\mu m$, L=1.0 $\mu m$

EFFECTS OF THE INVENTION

In the manufacturing process according to the present invention, since the TFT-forming Si single crystal 3 is grown up on the $SiO_2$ layer 2 with the substrate Si single crystal as a species, both the trench capacitor and the transistor are interconnected with the Si single crystal in the self alignment manner in the finished memory cell. In addition, since the TFT is formed on the $SiO_2$ layer 2, separation means for separating the capacitor and the adjacent transistor are simultaneously installed in this TFT forming step. Furthermore, since the three-layer film 4 and etching mask of the TFT-forming Si single crystal layer 3 are deviated from the window formed on the $SiO_2$ layer 2, the trench capacitor and transistor are connected with each other by means of the single crystal region 5 in the self alignment manner. Simultaneously, the inter-element separation of each memory cell can be achieved so that the manufacturing process of the semiconductor memory device having trench capacitors becomes considerably easy.

In addition, in the structure of the semiconductor memory device according to the present invention, since the transistor installed on the $SiO_2$ layer 3 has a Silicon on Insulating Substrate (SOI) construction, a space required for the inter-element separation can be smaller than the conventional space. In other words, both the transistor and the capacitor are separated with sides of the $SiO_2$ layer 3 in its depth direction and its lateral direction selectively formed which is a field oxidization film.

Since a PN junction including a P+ region 2 serves to separate one of the capacitors from the adjacent capacitor, the structure to separate each element of the DRAM according to the present invention is simpler than that of the conventional DRAM.

Since the N+ diffusion layer, the one electrode of the capacitor of the memory cell is connected to the source region of the TFT via the single crystal, the connection of both capacitor and transistor can be more accurate than that in the conventional DRAM.

The DRAM manufactured according to the present invention does not require an extremely high level technique of the conventional DRAM using the trench capacitors in which two sheets of thin oxidization films in the polycrystalline Si are placed within each trench. The present invention has adopted a simple element structure and has simplified the inter-element separation. Both capacitor and transistor are separated by means of the field oxidization film 3 in its depth and lateral directions. Between each capacitor is separated with the PN junction. Consequently, the cell size was as small as 3.75 $\mu m^2$ and the capacitance of each capacitor was as large as 55.6 fF.

In the structure of the DRAM according to the present invention, each capacitor is connected to the corresponding transistor with N+ single crystal layer in the selfalignment manner.

Furthermore, since the separation of each capacitor is carried out with the PN connection including P+ region, the structure of separating each element of the DRAM according to the present invention is an extremely simpler than that of the conventional DRAM.

It will clearly be understood by those skilled in the art that the foregoing description has been made in terms of the preferred embodiments and various changes and modifications may be made without departing from the scope of the present invention which is to be defined by the appended claims.

What is claimed is:
1. A manufacturing process for a semiconductor memory device, each memory cell thereof comprising one transistor and one capacitor, the process comprising the steps of:
   (a) selectively forming an insulating layer on a semiconductor substrate;
   (b) forming a semiconductor layer on the insulating layer, the semiconductor layer being connected to the semiconductor substrate via an opening in the insulating layer;
   (c) forming a protective layer on the semiconductor layer;
   (d) forming a window through the protective layer at a position of the protective layer offset from the opening in the insulting layer and forming a trench through the window with the insulating layer and protective layer serving as masks so that the semiconductor layer is still connected to the semiconductor substrate via the opening in the insulating layer; and
   (e) forming the capacitor in the trench with the transistor formed in the semiconductor layer.

2. The manufacturing process according to claim 1, wherein in the step (d), a part of the semiconductor layer remains on an edge portion of the end of an opposing insulating layer to the insulating layer when the trench is formed through the window.

3. The manufacturing process according to claim 1, wherein the steps (a), (b), and (c) are carried out in such a way that a lateral crystal growth is carried out through a window of $SiO_2$ having a width of substantially 1.0 $\mu m$ with a single crystal of a P type Si semiconductor substrate as seed.

4. The manufacturing process according to claim 3, wherein the insulating layer is a $SiO_2$ layer, the semiconductor layer is a Si crystal grown up on the $SiO_2$ layer, and the protective layer comprises a first layer of $SiO_2$ film, a second layer of $Si_3N_4$ film, and a third layer of $SiO_2$ film.

5. The manufacturing process according to claim 4, wherein the step (d) includes the steps of applying a photo resist to the three-layer film, and removing the three-layer film to which the photo resist is applied together with a part of the Si crystal layer so as to form the window.

6. The manufacturing process according to claim 5, wherein the step (d) includes the steps of oxidizing an inner surface of the trench.

7. The manufacturing process according to claim 5, wherein the window is formed by a photo etching method.

8. The manufacturing process according to claim 5, wherein the trench is formed by a RIE (Reactive Ion Etching) method.

9. The manufacturing process according to claim 5, wherein the predetermined width of the window coincides with an interval between the respective ends of the insulating layer, and of the opposing insulating layer and the width of the trench is substantially 0.7 $\mu m$.

10. The manufacturing process according to claim 6, wherein the step e), an N+ region is formed on an inside surface of the trench with a donor diffused, the N+ region serving as one electrode of the capacitor and being integrated to a source of the transistor formed in the Si layer.

11. The manufacturing process according to claim 10, wherein the step (e), a heat oxidization is carried out on an inside surface of the trench to form a capacitor insulation film and polycrystalline Si is thereafter buried in the trench to form a cell plate of the capacitor.

12. The manufacturing process according to claim 11, wherein the step (d) further includes after the uppermost third layer of $SiO_2$ film is removed, a step of oxidizing the surface of the polycrystalline Si and growing a gate oxidization film with the second layer of $Si_3N_4$ film of the three-layer film removed.

13. The manufacturing process according to claim 2, wherein a heat oxidization is carried out at least on the remaining part of the semiconductor film to form an oxidization film thereon.

14. A method for making a semiconductor memory device having a memory cell with a transistor and a capacitor, comprising the steps of:
   (a) forming a semiconductor layer on an insulating layer formed on a semiconductor substrate so that said semiconductor layer is connected to the semiconductor substrate through an opening in the insulating layer;
   (b) forming a protective layer on the semiconductor layer;
   (c) forming a window through the protective layer at a position offset from the opening in the insulating layer;
   (d) forming a trench through the window so that the insulating layer and the protective layer serve as masks such that the semiconductor layer remains connected to the semiconductor substrate through the opening in the insulating layer; and
   (e) forming a capacitor in the trench and a transistor in the semiconductor layer.

15. The method as set forth in claim 14 wherein the step of forming in step (c) is followed by a step of removing a portion of said semiconductor layer in a way in which a small amount of said semiconductor layer remains at an end of said insulating layer to insure separation between the capacitor and an adjacent transistor in a finished semiconductor memory device.

16. The process as set forth in claim 14 further including a step of oxidizing a surface of the trench to form an oxidation film thereon.

17. The process as set forth in claim 14 further including a step of providing a donor layer on a surface of said trench to act as an electrode of said capacitor.

18. The process as set forth in claim 17 wherein said donor-providing step is further characterized in that said donor surface is integrated with said transistor.

19. The process as set forth in claim 18 further including a step of burying a material into the trench to function as a cell plate of the capacitor.

20. The process as set forth in claim 19 further including a step of oxidizing the upper surface of said cell plate material.

* * * * *